US009660110B2

(12) United States Patent
Kim et al.

(10) Patent No.: US 9,660,110 B2
(45) Date of Patent: May 23, 2017

(54) VARACTOR DEVICE WITH BACKSIDE CONTACT

(71) Applicant: QUALCOMM Incorporated, San Diego, CA (US)

(72) Inventors: Daeik Daniel Kim, San Diego, CA (US); Jonghae Kim, San Diego, CA (US); Chengjie Zuo, Santee, CA (US); Sang-June Park, San Diego, CA (US); Changhan Hobie Yun, San Diego, CA (US); Mario Francisco Velez, San Diego, CA (US); David Francis Berdy, San Diego, CA (US); Matthew Michael Nowak, San Diego, CA (US); Robert Paul Mikulka, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/498,359

(22) Filed: Sep. 26, 2014

(65) Prior Publication Data

US 2016/0093750 A1 Mar. 31, 2016

(51) Int. Cl.
*H01L 29/93* (2006.01)
*H01L 29/94* (2006.01)
*H01L 27/06* (2006.01)

(52) U.S. Cl.
CPC .............. *H01L 29/93* (2013.01); *H01L 29/94* (2013.01); *H01L 27/0629* (2013.01)

(58) Field of Classification Search
CPC ...................................................... H01L 29/93
See application file for complete search history.

(56) References Cited

U.S. PATENT DOCUMENTS

| 6,825,546 | B1 | 11/2004 | Walker et al. |
| 8,273,616 | B2 | 9/2012 | Chen et al. |
| 8,450,827 | B2 | 5/2013 | Huang et al. |
| 8,803,288 | B1 | 8/2014 | Marino et al. |
| 2007/0275533 | A1* | 11/2007 | Vaed ................ H01L 21/76898 438/329 |
| 2009/0134960 | A1 | 5/2009 | Larson et al. |
| 2010/0019351 | A1 | 1/2010 | Ratnakumar et al. |
| 2012/0235731 | A1 | 9/2012 | Li et al. |
| 2012/0281336 | A1* | 11/2012 | Marino .................... H01G 7/00 361/281 |
| 2013/0146959 | A1 | 6/2013 | Cheng et al. |
| 2014/0367832 | A1* | 12/2014 | Marino ............... H01L 29/0615 257/597 |
| 2015/0194538 | A1* | 7/2015 | Marino ................ H01L 29/94 327/530 |

FOREIGN PATENT DOCUMENTS

GB  2138206 A  10/1984

OTHER PUBLICATIONS

International Search Report and Written Opinion for International Application No. PCT/US2015/048632, ISA/EPO, Date of Mailing Nov. 17, 2015, 12 pages.

* cited by examiner

*Primary Examiner* — Lex Malsawma
(74) *Attorney, Agent, or Firm* — Toler Law Group, PC

(57) ABSTRACT

An apparatus includes a varactor having a first contact that is located on a first side of a substrate. The varactor includes a second contact that is located on a second side of the substrate, and the second side is opposite the first side. The apparatus further includes a signal path between the first contact and the second contact.

30 Claims, 6 Drawing Sheets

VARACTOR DEVICE WITH BACKSIDE CONTACT

I. FIELD

The present disclosure is generally related to variable capacitor (varactor) devices.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Wireless telephones and other electronic devices may include passive components, such as inductors, resistors, and capacitors, which may facilitate transmission and reception of signals in a network. The passive components may be configured to perform functions including tuning, filtering, impedance matching, and gain control. To illustrate, a transceiver of an electronic device may include a variable capacitor (varactor). The electronic device may adjust a capacitance of the varactor to tune the transceiver to receive and transmit signals associated with a particular frequency band. In some implementations, operation of a varactor may deviate substantially from "ideal" varactor behavior, which may reduce performance of the transceiver. For example, capacitance of a varactor may change non-linearity with respect to a time-varying input voltage from the bias of the varactor set by a direct current (DC) bias voltage. In this case, capacitance of the varactor may be imprecisely controlled, which may reduce device performance (e.g., due to increased current dissipation caused by poor tuning of the varactor, or increased non-linearity to distort signal).

III. SUMMARY

A varactor device may include a first contact positioned on a front side of a substrate and a second contact (e.g., a backside contact) positioned on a backside of the substrate. Use of the backside contact may reduce an impedance associated with the varactor device, which may improve device signal loss and operation. To illustrate, a radio frequency (RF) signal may be conducted via a signal path between the first contact and the second contact, and the signal path may have a shorter length (and less impedance) as compared to an RF signal path of a varactor that uses two front-side contacts through semiconductor material. Thus, use of the backside contact may reduce attenuation of the RF signal. In a particular embodiment, the varactor device is integrated within a transceiver.

The varactor device may further include a third contact and a fourth contact. The third contact and the fourth contact may be responsive to a bias voltage to change a size of one or more depletion regions of the varactor device. By changing the size of a depletion region, a width of the signal path of the varactor device may be changed, enabling control of the capacitance of the varactor. In this example, a width of a "plate" of a capacitive region of the varactor device may be adjusted, which may enable more precise capacitance control as compared to a device that adjusts only a distance between "plates" of a capacitive region.

In addition, the RF signal and the bias voltage may be separately applied to the varactor device using the first contact, the third contact, and the fourth contact. For example, instead of applying both an RF signal and a bias voltage to a single pair of contacts, the RF signal may be applied to the first contact, and the bias voltage may be applied to the third contact and to the fourth contact. Separately applying an RF signal and a bias voltage may improve response linearity as compared to a two-port varactor device that applies both an RF signal and a bias voltage to a single pair contacts. For example, use of the third contact and the fourth contact may enable more precise biasing control by avoiding "mixing" of an RF signal and a bias voltage (which can cause nonlinearity of device operation).

In a particular embodiment, an apparatus includes a varactor having a first contact that is located on a first side of a substrate. The varactor includes a second contact that is located on a second side of the substrate, and the second side is opposite the first side. The apparatus further includes a signal path between the first contact and the second contact.

In another particular embodiment, a method includes providing a signal to a first contact of a varactor device. The first contact is located on a first side of a substrate. The method further includes conducting the signal through a signal path between the first contact and a second contact of the varactor device. The second contact is located on a second side of the substrate, and the second side is opposite the first side.

In another particular embodiment, an apparatus includes means for providing a first signal to a capacitive region of a varactor device. The means for providing the first signal is located on a first side of a substrate. The apparatus further includes means for receiving a second signal from the capacitive region. The means for receiving the second signal is located on a second side of the substrate, and the second side is opposite the first side.

In another particular embodiment, a computer-readable medium stores instructions that are executable by a processor to initiate operations. The operations include forming a first contact of a varactor device. The first contact is located on a first side of a substrate. The operations further include forming a second contact of the varactor device. The second contact is located on a second side of the substrate, and the second side is opposite the first side. A signal path of the varactor device is located between the first contact and the second contact.

One particular advantage provided by at least one of the disclosed embodiments is reduced RF signal attenuation at a varactor device. For example, use of a backside contact may reduce a length of a signal path between contacts of the varactor device, thus reducing impedance and signal loss. Another particular advantage provided by at least one of the disclosed embodiments is reduced contact resistance. For example, a high-conductivity material of the backside contact may reduce contact resistance. Another particular advantage provided by at least one of the disclosed embodiments is enhanced linearity of response to a bias voltage. For example, by changing a size of a depletion region of the varactor device, capacitance of the varactor device may be controlled more accurately (and more linearly) as compared to other varactors. Other aspects, advantages, and features of the present disclosure will be described or become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular examples are described below with reference to the drawings. Similar or common features are designated by common reference numbers throughout the description and the drawings.

Figure 1:
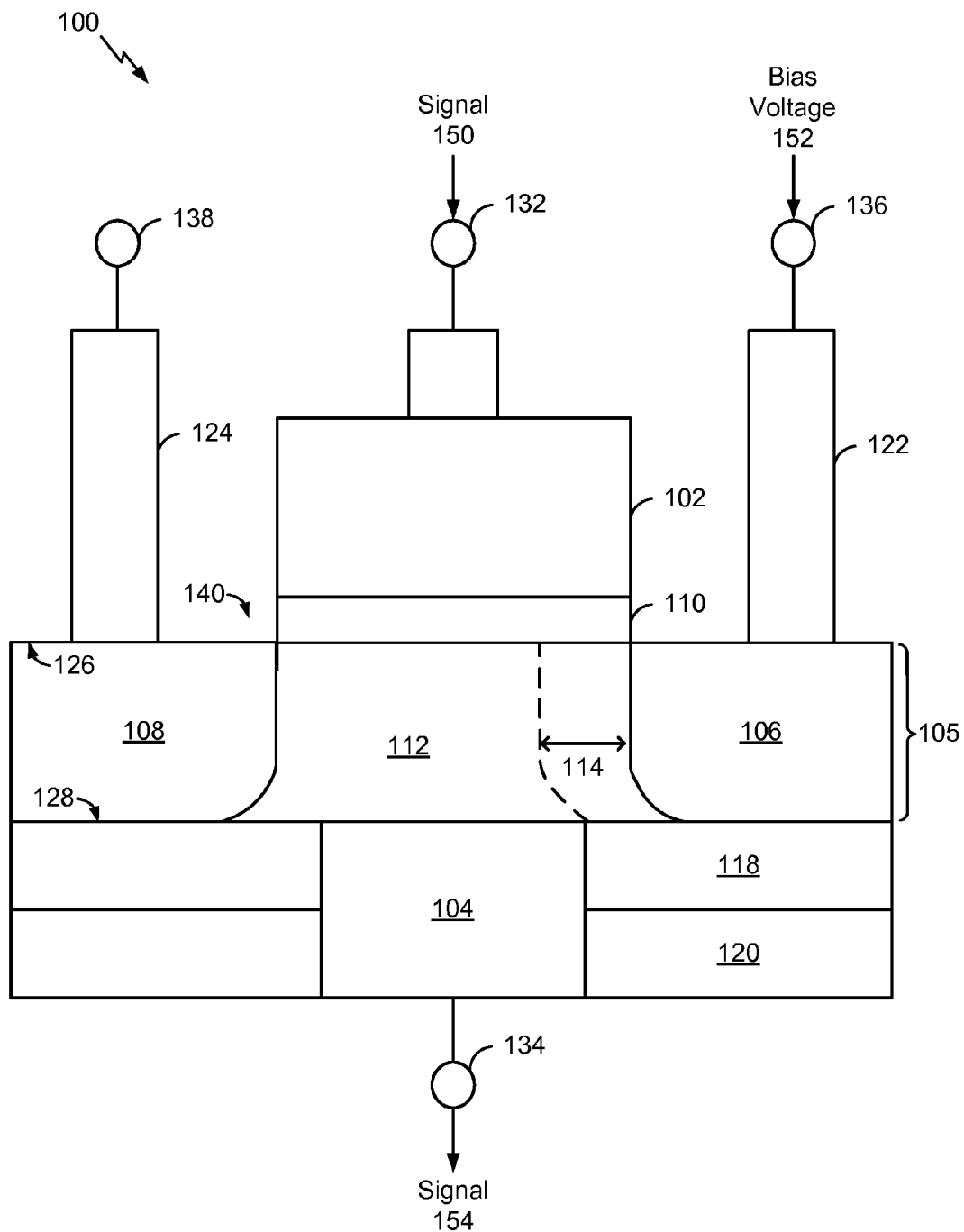
FIG. 1 is a diagram of an illustrative example of a varactor device that includes a backside contact.

Referring to FIG. 1, a particular illustrative embodiment of a variable capacitor (varactor) device is depicted and generally designated 100. The varactor device 100 may be integrated within an electronic device, such as within a transceiver, as an illustrative example. To further illustrate, the transceiver (e.g., a receiver front-end of the transceiver) may include one or more varactor devices corresponding to the varactor device 100. The transceiver may utilize the one or more varactor devices to tune to receive and transmit one or more signals that are conveyed using a particular frequency or frequency band. In this example, the one or more varactors may have a frequency response that filters received signals, such as by suppressing or reducing certain low-frequency signal components.

The varactor device 100 includes a first contact 102, a second contact 104, a third contact 122, and a fourth contact 124. The varactor device 100 further includes a substrate 105, a dielectric material 110 (e.g., a gate oxide material, such as a silicon dioxide material), and a buried oxide (BOX) layer 118. Depending on the particular fabrication process, the varactor device 100 may include a support layer, such as a "handle" silicon layer 120 (e.g., a bulk silicon layer). The substrate 105 may be a silicon substrate, a glass substrate, or a silicon-on-insulator substrate, as illustrative examples. In the example of FIG. 1, the substrate 105, the BOX layer 118, and the handle silicon layer 120 may form a silicon-on-insulator (SOI) structure. Depending on the particular fabrication process, the handle silicon layer 120 may be removed or substantially removed from the varactor device 100 during fabrication of the varactor device 100 (e.g., using an etch process or a grinding process).

The substrate 105 includes a first side (e.g., a front-side) and a second side (e.g., a backside). For example, a first surface 126 of the substrate 105 may define the first side, and a second surface of the substrate 105 may define the second side. In FIG. 1, the first contact 102, the third contact 122, and the fourth contact 124 are located on the first side of the substrate 105, and the second contact 104 is located on the second side of the substrate 105. The first side is opposite to the second side. Although FIG. 1 illustrates that the third contact 122 is located on the first side of the substrate 105, it is noted that in another implementation the contacts 104, 122 may both be placed on the second side of the substrate 105.

The substrate 105 may include a signal path 112 that is configured to conduct signals from the first port 132 and the first contact 102 to the second contact 104 and the second port 134. The first contact 102, the dielectric material 110, and the signal path 112 may form a capacitive region 140.

The substrate 105 may have a complementary metal-oxide-semiconductor (CMOS) configuration that includes doped regions. To illustrate, the substrate 105 may include a first highly doped region 106 and a second highly doped region 108. In a particular implementation, the first highly doped region 106 is an n-type region that includes one or more n-type materials (e.g., n+ materials), and the second highly doped region 108 is a p-type region that includes one or more p-type materials (e.g., p+ materials). In another example, both the first highly doped region 106 and the second highly doped region 108 are n-type regions that include one or more n-type materials (e.g., n+ materials), such as described further with reference to FIG. 2.

The varactor device 100 may be implemented as a CMOS device, such as a metal-oxide-semiconductor field-effect transistor (MOSFET) type device. For example, the first highly doped region 106 may correspond to a drain terminal of the MOSFET type device, and the second highly doped region 108 may correspond to a source terminal of the MOSFET type device. The dielectric material 110 and the first contact 102 may correspond to a gate terminal (or "gate stack") of the MOSFET type device. Alternatively, the varactor device 100 may be implemented using one or more other materials and/or processes.

During operation, a signal 150 may be applied to the first port 132 (e.g., from another device via a connection not shown in FIG. 1). The signal 150 may be a radio frequency (RF) signal. The signal 150 may be an alternating current (AC) signal. The signal 150 may be applied to the signal path 112 of the varactor device 100 via the first contact 102 and the dielectric material 110. For example, the ports 132, 134 may be AC coupled via the capacitive region 140. Application of the signal 150 may create a depletion region 114 (e.g., an insulating region that is substantially free of charge carriers) within the substrate 105 due to a charge carrier diffusion effect.

A capacitance of the capacitive region 140 may be changed using one or more control signals, such as using a bias voltage 152 (e.g., a DC signal). For example, a size of the depletion region 114 may be adjusted using the bias voltage 152, which may change the capacitance of the capacitive region 140. To further illustrate, the first contact 102 may correspond to a first charge accumulation region (or a first "plate") of the capacitive region 140, and the signal path 112 may correspond to a second "plate" of the capacitive region 140. The first plate and the second plate are separated by the dielectric material 110. By adjusting the bias voltage 152, a width of the depletion region 114 may be increased or decreased. In this case, a plate area of the second plate is changed, which modifies capacitance of the capacitive region 140 (because the capacitance is proportional to the plate area). As used herein, "width" of the depletion region 114 may refer to a horizontal extent of the depletion region 114 relative to the orientation of FIG. 1 (e.g., an extent between the first highly doped region 106 and the signal path 112). As used herein, "height" of the depletion region 114 may refer to a vertical extent of the depletion region 114 relative to the orientation of FIG. 1 (e.g., an extent between the dielectric material 110 and the BOX layer 118).

The capacitive region 140 may filter the signal 150 to generate a signal 154. For example, the capacitive region 140 may filter out certain frequency components of the signal 150 to generate the signal 154, such as by filtering out a direct current (DC) frequency component of the signal 150.

Depending on the particular implementation, the fourth contact 124 may be biased using a second bias voltage (not shown) that is different than the bias voltage 152. In some implementations, the fourth contact 124 may be coupled to a ground node via the fourth port 138. In another example, the fourth contact 124 is biased using the bias voltage 152. For example, the contacts 122, 124 may be connected via a common node, such as described further with reference to FIG. 2.

FIG. 1 illustrates that a varactor device 100 may have a four-port configuration. The four-port configuration may improve response linearity during operation. For example, by applying the signal 150 and the bias voltage 152 to different ports, "mixing" of the signal 150 and the bias voltage 152 is reduced or avoided. In a device that "mixes" the signal 150 and the bias voltage 152, the signal 150 may occasionally have a large magnitude that "overrides" the bias voltage 152, resulting in a nonlinear effect in some cases. FIG. 1 illustrates that a nonlinear effect can be mitigated or avoided using a multi-port configuration, thus improving response linearity of the varactor device 100 and increasing a quality metric (e.g., Q-factor) associated with the varactor device 100.

Further, adjusting the width of the depletion region 114 may improve device performance as compared to a device that modulates a "plate distance" between capacitive regions. To illustrate, a device may change a height of a depletion region that forms beneath a dielectric. In this example, the width of the depletion region and a width of the dielectric may be substantially "fixed," and the device may change a height of the depletion region to adjust capacitance of the capacitive region. Changing the height of the depletion region in this manner may increase capacitance by modifying a "plate distance" associated with the capacitive region (because capacitance is inversely proportional to plate distance) and may also increase impedance of the signal path. Thus, a resistance-capacitance (RC) product associated with the device may vary. The varactor device 100 of FIG. 1 may achieve a stable RC product using an "area-tuning" technique. For example, by increasing the width of the depletion region 114 (and decreasing "plate" area), capacitance of the varactor device is decreased, while impedance of the signal path 112 is increased (by reducing a channel width of the signal path 112). As a result, an RC product of the varactor device 100 may remain substantially constant during operation of the varactor device 100, which may improve device performance (e.g., by increasing response linearity).

Figure 2:
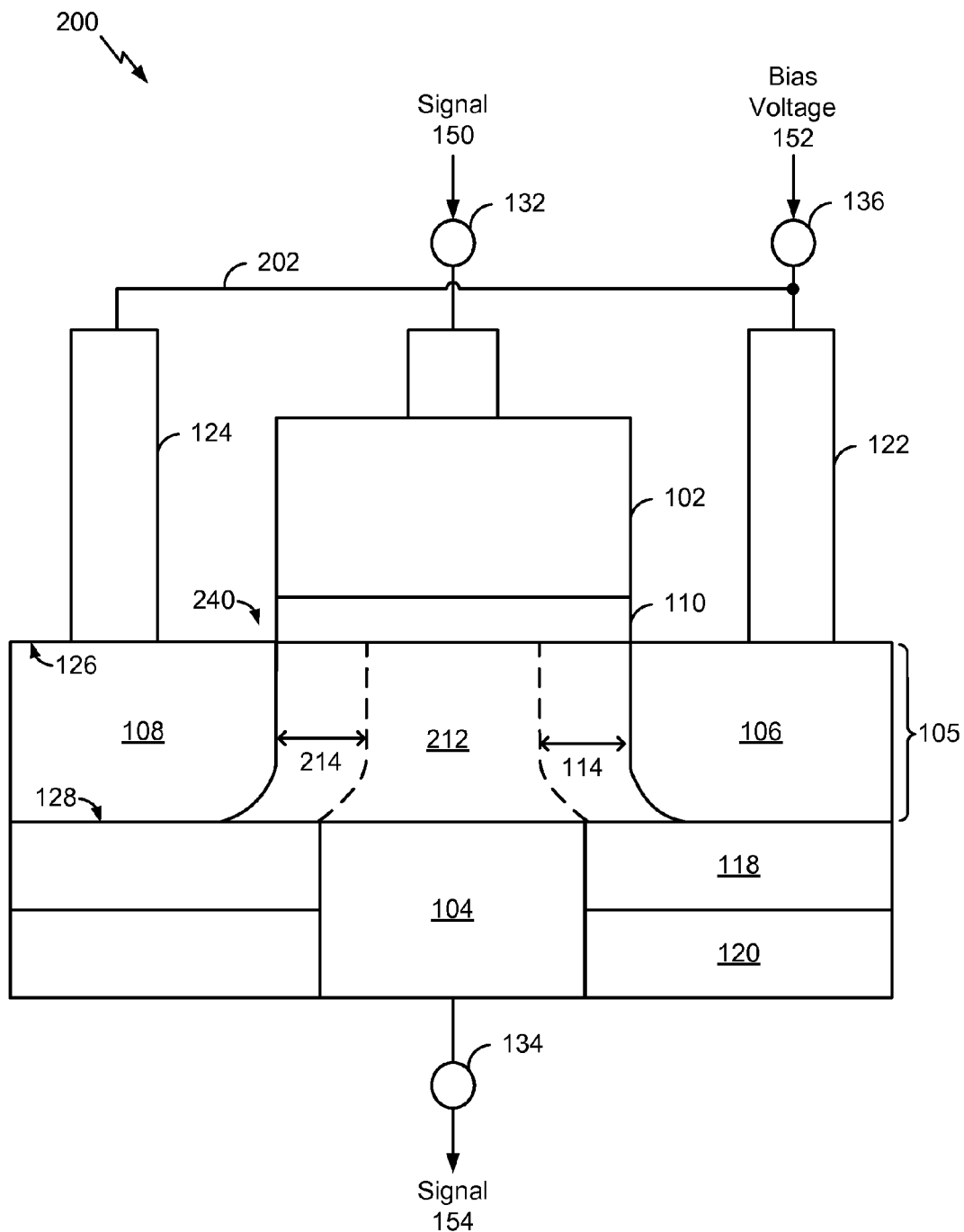
FIG. 2 is a diagram of another illustrative example of the varactor device of FIG. 1.

Referring to FIG. 2, a particular illustrative embodiment of the varactor device 100 of FIG. 1 is depicted and generally designated 200. In the example of FIG. 2, the varactor device 200 includes a node 202 connecting the third contact 122 and the fourth contact 124. The third contact 122 and the fourth contact 124 may be responsive to the bias voltage 152 via the node 202. The varactor device 200 may include a capacitive region 240 formed by the first contact 102, the dielectric material 110, and a signal path 212. In the example of FIG. 2, each of the highly doped regions 106, 108 may correspond to n-type regions that include one or more n-type materials (e.g., n+ materials).

During operation, a width of the signal path 212 is defined by the depletion region 114 and by a depletion region 214. For example, by controlling the bias voltage 152, widths of the depletion regions 114, 214 can be adjusted. Adjusting widths of the depletion regions 114, 214 changes capacitance of the capacitive region 240. During operation, the signal 150 may be "filtered" based on the capacitance to generate the signal 154.

The example of FIG. 2 illustrates that a varactor device 200 may include multiple depletion regions. Widths of the depletion regions can be controlled to adjust a capacitance of the varactor device, which may enable greater capacitance tuning (e.g., a greater range of capacitance values).

Figure 3:
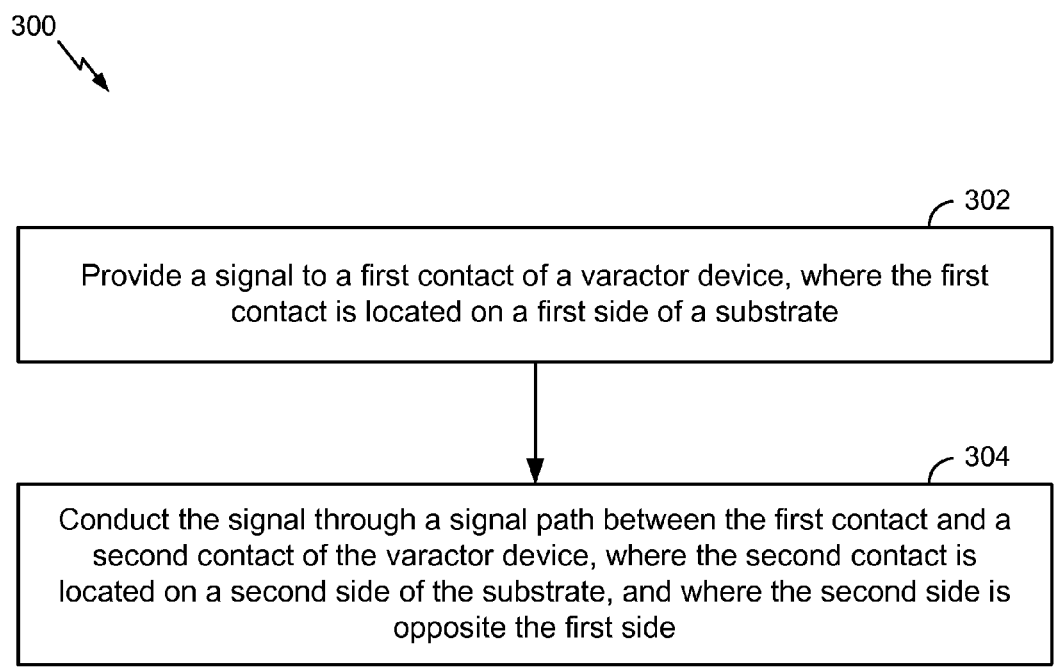
FIG. 3 is a diagram of an illustrative example of a method of operation of a varactor device, such as the varactor device of FIG. 1.

Referring to FIG. 3, a particular illustrative embodiment of a method is depicted and generally designated 300. The method 300 may be performed at a varactor device, such as at the varactor device 100 of FIG. 1 and/or the varactor device 200 of FIG. 2.

The method 300 includes providing a signal to a first contact of the varactor device, at 302. The first contact is located on a first side of a substrate. As an example, the signal may correspond to the signal 150, and the first contact may correspond to the first contact 102. The substrate may correspond to the substrate 105, and the first side may correspond to a front-side of the substrate 105.

The method 300 further includes conducting the signal through a signal path between the first contact and a second contact of the varactor device, at 304. The second contact is located on a second side of the substrate, and the second side is opposite the first side. As an example, the signal path may correspond to the signal path 112, and the second contact may correspond to the second contact 104.

In a particular embodiment, the signal (e.g., the signal 150) is an RF signal. The method 300 may further include generating a filtered RF signal at the second contact. The filtered RF signal may correspond to the signal 154.

Conducting the signal may include filtering the signal based on a capacitance associated with the varactor device. To illustrate, the capacitance of the capacitive region 140 or the capacitance of the capacitive region 240 may be based on a width of the depletion region 114. In this example, the method 300 may further include biasing the third contact using a bias voltage (e.g., the bias voltage 152) to adjust the width of the depletion region 114 (which may occur prior to providing the signal to the first contact and/or while the signal is provided to the first contact).

In some implementations, the method 300 may further include biasing a fourth contact of the varactor device using the bias voltage to adjust a width of a second depletion region. The fourth contact may correspond to the fourth contact 124, and the second depletion region may correspond to the depletion region 214. In this case, the capacitance of the capacitive region 240 is based further on the width of the depletion region 214.

In an illustrative embodiment, the method 300 is performed at a mobile device that includes the varactor device. In this case, the method 300 may include receiving the signal via a communication network using an antenna of the mobile device (prior to providing the signal to the first contact). An illustrative mobile device is described further with reference to FIG. 5.

The method 300 of FIG. 3 enables improved operation of a varactor device. For example, by providing a signal to a signal path between contacts of the varactor device on opposite sides of a substrate, impedance is reduced. In this case, a length of the signal path 112 of FIG. 1 may have less impedance as compared to another varactor device. Thus, signal attenuation is reduced, which may enhance signal quality and enable better reception of signals within a communication network, as an illustrative example. Further, use of separate contacts (e.g., the first contact 102 and the third contact 122 of FIG. 1) for a signal and a bias voltage may improve bias control and linearity of device response.

Figure 4:
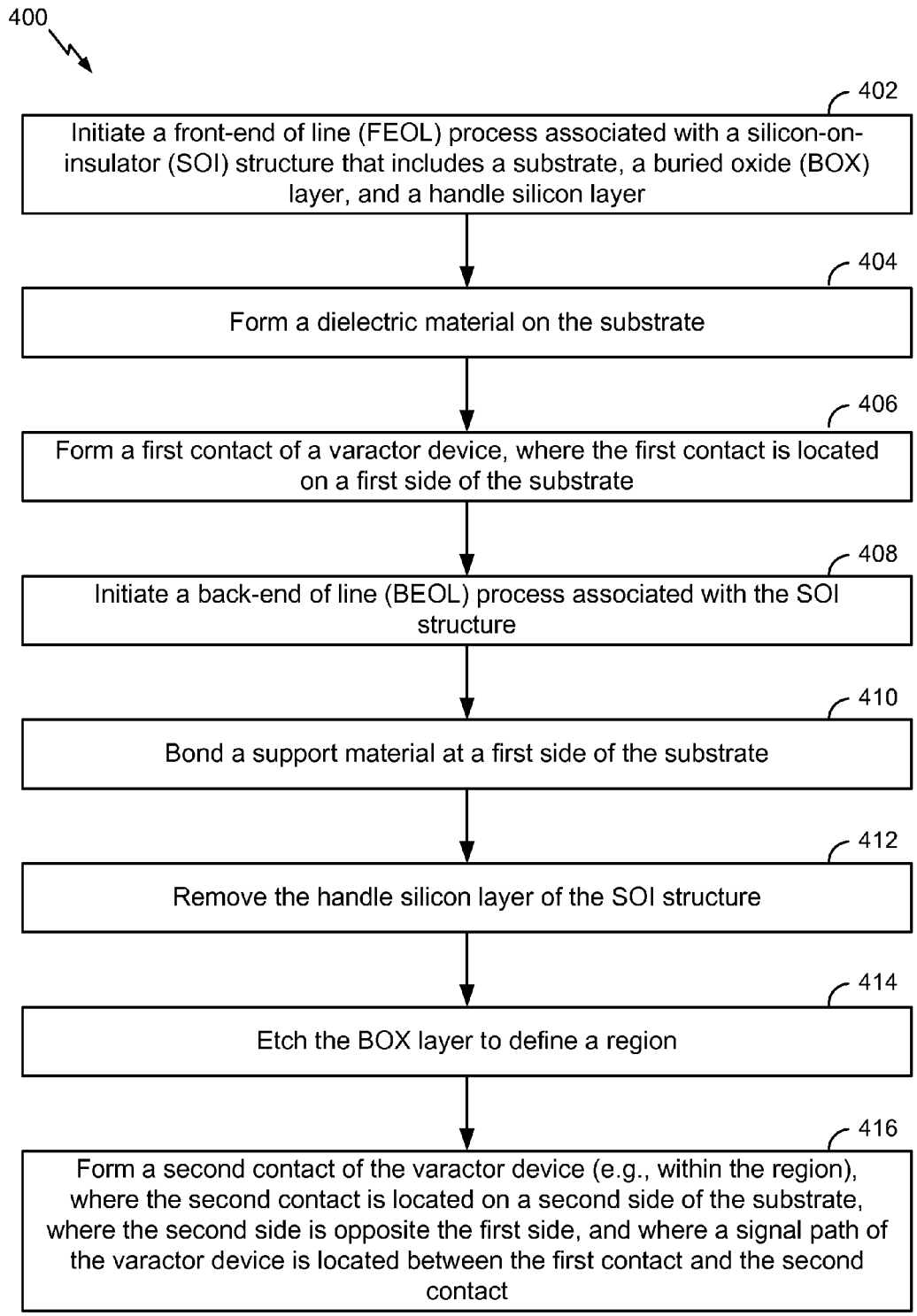
FIG. 4 is a diagram of an illustrative example of a method of fabricating a varactor device, such as the varactor device of FIG. 1.

Referring to FIG. 4, a particular illustrative embodiment of a method of fabricating a varactor device is depicted and generally designated 400. The varactor device may correspond to the varactor device 100 of FIG. 1 and/or the varactor device 200 of FIG. 2.

The method 400 includes initiating a front-end of line (FEOL) process associated with a silicon-on-insulator (SOI) structure, at 402. The SOI structure includes a substrate (e.g., the substrate 105), a buried oxide (BOX) layer (e.g., the BOX layer 118), and a handle silicon layer (e.g., the handle silicon layer 120).

The method 400 further includes forming a dielectric material on the substrate, at 404. For example, the dielectric material 110 may be formed on the substrate 105 using an oxide growth process, as an illustrative example.

The method 400 further includes forming a first contact of a varactor device, at 406. The first contact is located on the first side (e.g., a front side) of the substrate. As an example, the first contact may correspond to the first contact 102.

The method 400 further includes initiating a back-end of line (BEOL) process associated with the SOI structure, at 408. For example, BEOL operations may be initiated after FEOL operations that include forming transistors and other circuitry.

Prior to initiating the BEOL process, a passivation layer may be applied to a front-side of the SOI structure. The passivation layer may comprise a spin-on material or a deposited material, such as an oxide or boron phosphorous-doped silicate glass (BPSG). The passivation layer may provide electrical and mechanical protection to front-side components during the BEOL process. The passivation layer may include silicon oxide, silicon nitride, or polyimide, as illustrative examples.

The method 400 further includes bonding a support material at a first side of the substrate, at 410. The support material may include a front-side wafer, such as a front-side handle wafer or substrate. The support material may enable rotation of the SOI structure, such as in order to expose a backside of the SOI structure. For example, fabrication equipment of a fabrication system may rotate the SOI structure using the support material, which may enable backside fabrication processes.

The method 400 further includes removing the handle silicon layer of the SOI structure, at 412. The handle silicon layer may be removed using an etch process or a grinding process, as illustrative examples. In an illustrative implementation, the BOX layer 118 is etch resistant to a first etch process used to etch the handle silicon layer 120. In this case, the BOX layer 118 may function as an etch stop during removal of the handle silicon layer 120.

The method 400 further includes etching the BOX layer, at 414. Etching the BOX layer defines a region, such as an etched region in which a contact is to be formed. The BOX layer may be etched using a second etch process (e.g., a wet etch process or a dry etch process) that is different than the first etch process. In an alternate embodiment, a backside photolithography process may be applied to the BOX layer to define the region.

The method 400 further includes forming a second contact of the varactor device (e.g., within the region), at 416. The second contact is located on a second side (e.g., a backside) of the substrate, and the second side is opposite the first side. A signal path (e.g., the signal path 112) of the varactor device is located between the first contact and the second contact. The signal path may include a portion of the substrate (e.g., a silicon portion, which may include a p-type material).

After forming the second contact, the method 400 may optionally include removing the support material, such as using an etch process or a grinding process. For example, the SOI structure may be re-rotated to expose the front-side of the SOI structure, and the support material may be removed using an etch process or a grinding process. After removing the support material, one or more other components of the varactor devices 100, 200 may be formed (e.g., the contacts 122, 124). In other embodiments, the one or more components may be formed during the FEOL process (e.g., the contacts 122, 124 may be formed prior to initiating the BEOL process).

The method 400 enables efficient fabrication of a varactor device that includes a backside contact. For example, the method 400 may be performed using relatively inexpensive SOI and/or CMOS materials and processes. Further, a varactor device formed using the method 400 may exhibit improved operation, such as via reduced signal path impedance between a front-side contact and a backside contact of the varactor device.

One or more operations of the method 400 may be initiated, controlled, or performed by an electronic device. The electronic device may include a field-programmable gate array (FPGA) device, an application-specific integrated circuit (ASIC), a processing unit such as a central processing unit (CPU), a digital signal processor (DSP), a controller, another hardware device, a firmware device, or any combination thereof. In a particular embodiment, a computer-readable medium stores instructions that are executable by a processor to initiate the operations of the method 400.

Figure 5:
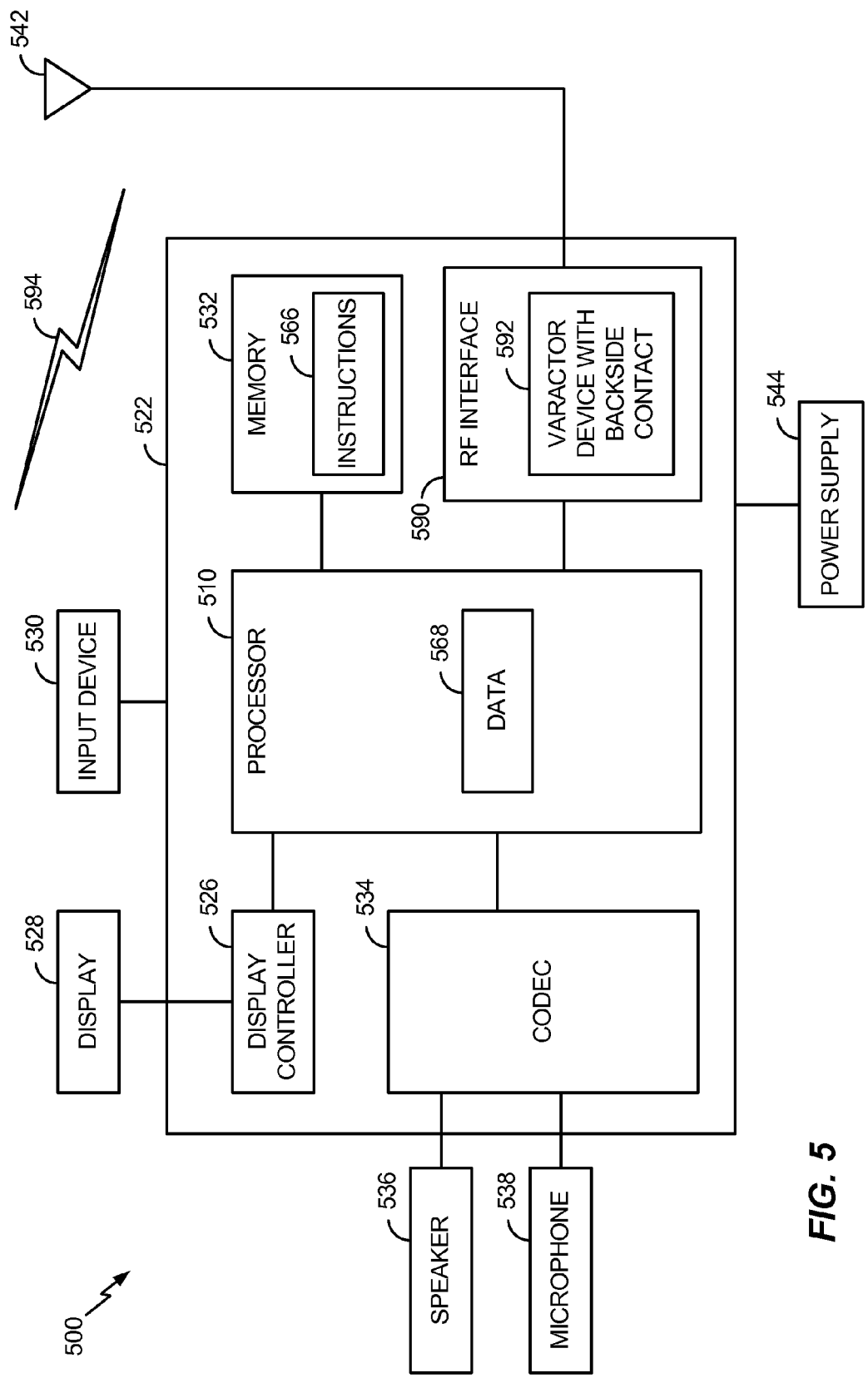
FIG. 5 is a block diagram of a device that includes a varactor device having a backside contact.

Referring to FIG. 5, a particular illustrative embodiment of a device is depicted and generally designated 500. In a particular embodiment, the device 500 is a mobile device that operates to communicate via a wireless communication network.

The device 500 includes a processor 510, such as a digital signal processor (DSP). The processor 510 is coupled to a memory 532. The processor 510 may read and write instructions 566 and/or data 568 at the memory 532. For example, the processor 510 may store the instructions 566 and/or the data 568 at the memory 532. As another example, the processor 510 may access the instructions 566 and/or the data 568 from the memory 532.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534.

The device 500 may include a radio frequency (RF) interface 590. The RF interface 590 may be connected to an antenna 542 and to the processor 510. The RF interface 590 includes a varactor device 592 that includes a backside contact (and at least one front-side contact). The varactor device 592 may correspond to one or both of the varactor devices 100, 200, and the backside contact may correspond to the second contact 104.

In a particular embodiment, the processor 510, the display controller 526, the memory 532, the CODEC 534, and the RF interface 590 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as to an interface or to a controller.

In a particular embodiment, the varactor device 592 is integrated within a front-end of a transceiver of the RF interface 590. For example, a capacitance of the varactor device 592 may be adjusted in order to tune to a particular frequency (or frequency band) in order to receive or transmit a signal 594 using the particular frequency (or frequency band). The signal 150 may be based on the signal 594. For example, the signal 594 may be processed by the RF interface 590 (e.g., by amplifying the signal 594 at a power amplifier stage of the RF interface 590) to generate the signal 150. The instructions 566 may be executable by the processor 510 to cause the RF interface 590 to tune to receive signals via the frequency (or frequency band) using the varactor device 592. Alternatively or in addition, a varactor device described herein may be integrated within another component or device, such as within the CODEC 534, the power supply 544, or a transmitter of the RF interface 590, as illustrative examples. For example, a varactor device may be used as a filter device of the CODEC 534, the power supply 544, or a transmitter of the RF interface 590 (e.g., to filter high-frequency "noise" signal components). In these examples, device operation may be improved by improving linearity of device response using one or more techniques described herein.

In connection with embodiments described herein, an apparatus includes means (e.g., the first contact 102) for providing a first signal (e.g., the signal 150) to a capacitive region (e.g., the capacitive region 140) of a varactor device (e.g., any of the varactor devices 100, 200, and 592). The means for providing the first signal is located on a first side of a substrate (e.g., the substrate 105). The apparatus further includes means (e.g., the second contact 104) for receiving a second signal (e.g., the signal 154) from the capacitive region. The means for receiving the second signal is located on a second side of the substrate, and the second side is opposite the first side. In an illustrative embodiment, the apparatus further includes means (e.g., the third contact 122 and/or the fourth contact 124) for biasing the varactor device using a bias voltage (e.g., the bias voltage 152).

Figure 6:
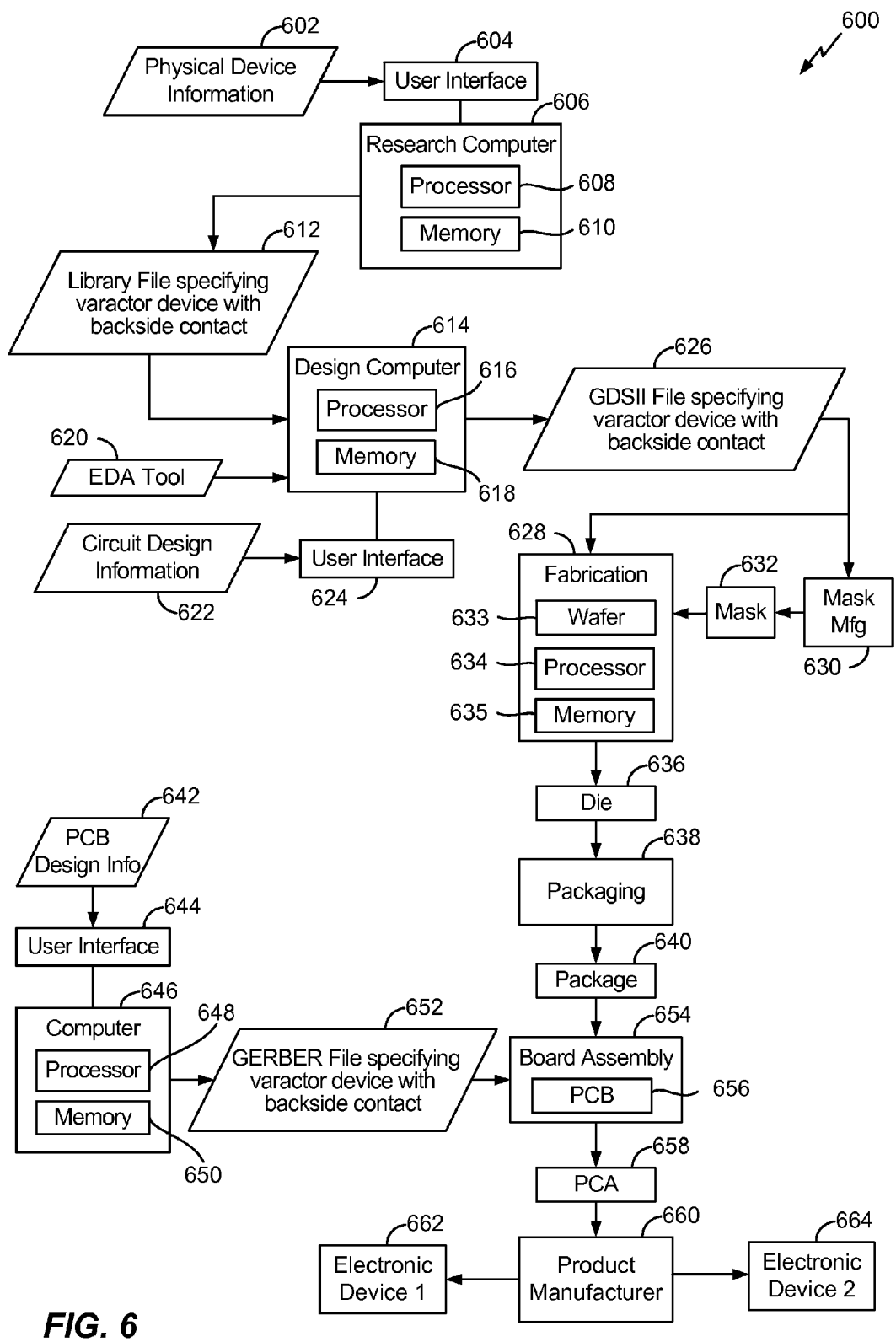
FIG. 6 is a data flow diagram of a particular illustrative embodiment of a manufacturing process to manufacture electronic devices that include a varactor device having a backside contact.

The foregoing disclosed devices and functionalities described with respect to FIGS. 1-5 may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into dies and packaged into chips. The chips can then be employed in devices, such as devices within the electronic device 500 of FIG. 5. FIG. 6 depicts a particular illustrative embodiment of an electronic device manufacturing process 600.

Referring to FIG. 6, physical device information 602 is received at the manufacturing process 600, such as at a research computer 606. The physical device information 602 may include design information specifying a varactor device that includes a backside contact. The varactor device may correspond to any of the varactor devices 100, 200, and 592, and the backside contact may correspond to the second contact 104.

The physical device information 602 may indicate one or more physical parameters, material characteristics, and structure information entered via a user interface 604 coupled to the research computer 606. The research computer 606 includes a processor 608, such as one or more processing cores, coupled to a computer readable medium, such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may specify a library of semiconductor devices including a varactor device that includes a backside contact. The varactor device may correspond to any of the varactor devices 100, 200, and 592, and the backside contact may correspond to the second contact 104.

The library file 612 may be used in conjunction with the EDA tool 620 at a design computer 614. The design computer 614 includes a processor 616 (e.g., one or more processing cores) coupled to a memory 618. The EDA tool 620 may include processor executable instructions stored at the memory 618 to enable a user of the design computer 614 to design a circuit including one or more of the varactor devices 100, 200, and 592. For example, a user of the design computer 614 may enter circuit design information 622 via a user interface 624 coupled to the design computer 614. The circuit design information 622 may include design information representing at least one physical property of one or more of the varactor devices 100, 200, and 592. To illustrate, the circuit design information 622 may identify particular circuits and relationships to other elements in a circuit design, positioning information, feature size information, interconnection information, or other information representing a physical property of a device (e.g., a semiconductor device).

The design computer 614 may be configured to transform the design information (including the circuit design information 622) to comply with a file format. To illustrate, the file format may include a database binary file format representing planar geometric shapes, text labels, and other information related to a circuit layout in a hierarchical format, such as a Graphic Data System (GDSII) file format. The design computer 614 may be configured to generate a data file including the transformed design information, such as a GDSII file 626. The GDSII file 626 may include information describing a varactor device that includes a backside contact (in addition to other circuits or information). The varactor device may correspond to any of the varactor devices 100, 200, and 592, and the backside contact may correspond to the second contact 104.

The GDSII file 626 may be received at a fabrication process 628 to manufacture any of the varactor devices 100, 200, and 592 according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, which may be tested and separated into dies, such as a representative die 636. The die 636 includes a circuit having any of the varactor devices 100, 200, and 592.

To further illustrate, a processor 634 and a memory 635 may initiate and/or control the fabrication process 628. The memory 635 may include instructions, such as computer-readable instructions or processor-readable instructions. The instructions may be executable by a processor, such as the processor 634. The instructions may be executable by the processor 634 to initiate operations of the method 400 of FIG. 4. In a particular embodiment, the instructions are executable by the processor 634 to perform operations including forming a first contact (e.g., the first contact 102) of a varactor device (e.g., any of the varactor devices 100, 200, and 592). The first contact is located on a first side of a substrate (e.g., the substrate 105). The operations further include forming a second contact (e.g., the second contact 104) of the varactor device. The second contact is located on a second side of the substrate, and the second side is opposite the first side. A signal path (e.g., the signal path 112 or the signal path 212) of the varactor device is located between the first contact and the second contact.

The fabrication process 628 may be implemented by a fabrication system that is fully automated or partially automated. For example, the fabrication process 628 may be automated according to a schedule. The fabrication system may include fabrication equipment (e.g., processing tools) to perform one or more operations to form a device. For example, the fabrication equipment may be configured to deposit one or more materials, epitaxially grow one or more materials, conformally deposit one or more materials, apply a hardmask, apply an etching mask, perform etching, perform planarization, and/or perform a wafer cleaning process, etc.

The fabrication system may have a distributed architecture (e.g., a hierarchy). For example, the fabrication system may include one or more processors, such as the processor 634, one or more memories, such as the memory 635, and/or one or more controllers that are distributed according to the distributed architecture. The distributed architecture may include a high-level processor that controls or initiates operations of one or more low-level systems. For example, a high-level processor may include one or more processors, such as the processor 634, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 634.

Alternatively, the processor 634 may be a part of a high-level system, subsystem, or component of the fabrication system. In another embodiment, the processor 634 initiates or controls distributed processing operations associated with multiple levels and components of a fabrication system.

Thus, the processor 634 may access processor-executable instructions that, when executed by the processor 634, cause the processor 634 to initiate or control formation of a device. The device may include one or more materials formed using one or more doping tools, such as a molecular beam epitaxial growth tool, a flowable chemical vapor deposition (FCVD) tool, a conformal deposition tool, and/or a spin-on deposition tool. During fabrication of the device, one or more materials may be removed (e.g., etched) from the device using one or more removal tools, such as a chemical removal tool, a reactive gas removal tool, a hydrogen reaction removal tool, a planarization tool, and/or a standard clean 1 type removal tool.

The executable instructions included in the memory 635 may enable the processor 634 to initiate or control formation of a device or structure described herein. For example, the executable instructions may enable the processor 634 to initiate or control formation of the any of the varactor devices 100, 200, and 592.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged device on a circuit board. The packaged device may correspond to the package 640, and the package 640 may include any of the varactor devices 100, 200, and 592.

The computer 646 may be configured to transform the PCB design information 642 to generate a data file, such as a GERBER file 652, with data that includes physical positioning information of a packaged semiconductor device on a circuit board, as well as layout of electrical connections, such as traces and vias. The packaged semiconductor device may correspond to the package 640 and may include any of the varactor devices 100, 200, and 592. In other embodiments, the data file generated by the transformed PCB design information may have a format other than a GERBER format.

The GERBER file 652 may be received at a board assembly process 654 and may be used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a mobile device, a computer, a set top box, a music player, a video player, an entertainment unit, a navigation device, a communications device, a personal digital assistant (PDA), or a fixed location data unit, into which any of the varactor devices 100, 200, and 592 may be integrated. As another illustrative, non-limiting example, one or more of the electronic devices 662 and 664 may include mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. It should be appreciated that the disclosure is not limited to these illustrated devices.

A device that includes any of the varactor devices 100, 200, and 592 may be fabricated, processed, and incorporated into an electronic device, as described in the illustrative process 600. One or more aspects of the embodiments described herein may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654. One or more aspects of the embodiments described herein may be incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

A conductive region described herein may include a silicon material (e.g., polycrystalline silicon) or a metal, such as copper (Cu) or aluminum (Al), tungsten (W), or one or more alloys thereof. To illustrate, the first contact 102 may include polycrystalline silicon or a metal (e.g., tungsten), as illustrative examples. The second contact 104 may include a metal, such as copper (Cu) or aluminum (Al), which may be deposited or formed during a BEOL process (e.g., instead of a tungsten material that is deposited or formed using a FEOL process). Thus, by forming the second contact 104 during a BEOL process, the second contact 104 may include a low-resistivity material (e.g., copper) not typically utilized in connection with a FEOL process. Thus, signal path resistance and signal loss is reduced as compared to a device that forms each varactor contact using a FEOL process. It is noted that one or more materials described herein may include a thin film material that is deposited using a thin film deposition process.

In a particular embodiment and as illustrated in the examples of FIGS. 1 and 2, the first contact 102 and the second contact 104 may be substantially aligned in order to reduce a signal path length. The reduced signal path length may reduce impedance of the signal path, thus lowering signal attenuation. In other applications, the first contact 102 and the second contact 104 may be offset or partially offset (e.g., as a result of circuit design parameters, design rules, fabrication process, etc.).

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. For example, one or more operations of the method 400 of FIG. 4 may be initiated, controlled, or performed using a processor that executes instructions. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the present disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a substrate;
   a first insulator layer;
   a first contact, wherein the first insulator layer is disposed between the first contact and the substrate;
   a second insulator layer in contact with the substrate; and
   a second contact that extends at least partially through the second insulator layer, wherein the substrate is disposed between the second insulator layer and the first insulator layer, and wherein the substrate includes a first doped region, a second doped region, and a signal path region between the first doped region and the second doped region.

2. The apparatus of claim 1, further comprising:
   a third contact, the first doped region disposed between the third contact and the second insulator layer, wherein a capacitance associated with the signal path region is adjustable based on a bias voltage applied to the third contact; and a fourth contact, the second doped region disposed between the fourth contact and the second insulator layer.

3. The apparatus of claim 2, wherein the bias voltage is configured to cause a change in a width of a depletion region of the substrate.

4. The apparatus of claim 2, wherein the fourth contact is configured to receive the bias voltage to adjust a width of a second depletion region of the substrate.

5. The apparatus of claim 1, wherein the substrate, the first insulator layer, the first contact, the second insulator layer, and the second contact are included in a varactor device.

6. The apparatus of claim 1, wherein the first doped region comprises a p-type region, and wherein the second doped region comprises an n-type region.

7. The apparatus of claim 1, wherein the first doped region and the second doped region each comprise an n-type region.

8. The apparatus of claim 1, wherein the first contact is configured to receive a radio-frequency (RF) signal.

9. The apparatus of claim 1, wherein the first insulator layer is comprised of a dielectric material.

10. The apparatus of claim 1, wherein the second contact comprises a backside contact that is disposed on a backside of the substrate.

11. The apparatus of claim 1, wherein the substrate comprises silicon, wherein the substrate comprises a silicon on insulator (SOI) structure, and wherein the second contact is a backside contact extending through an insulator of the SOI structure.

12. The apparatus of claim 1, further comprising a die, wherein the die comprises the first contact and the second contact.

13. The apparatus of claim 12, further comprising a device that includes a mobile device, a computer, a set top box, a music player, a video player, an entertainment unit, a navigation device, a communications device, a personal digital assistant (PDA), or a fixed location data unit, wherein the die is integrated within the device.

14. The apparatus of claim 1, wherein the first contact is configured to receive a signal, and wherein the second contact is configured to receive the signal from the first contact via a signal path.

15. The apparatus of claim 14, wherein the signal comprises a radio frequency (RF) signal, and wherein the second contact is configured to generate a filtered version of the RF signal.

16. The apparatus of claim 15, wherein a capacitance of a capacitive region is based on a width of a first depletion region of the substrate, and further comprising a third contact, the third contact configured to receive a bias voltage to adjust the width of the first depletion region.

17. The apparatus of claim 16, further comprising a fourth contact, the fourth contact configured to receive the bias voltage to adjust a width of a second depletion region of the substrate.

18. The apparatus of claim 17, wherein the capacitance is based further on the width of the second depletion region.

19. An apparatus comprising:
means for forming a capacitive region;
first means for inhibiting a flow of charge carriers;
means for providing a first signal, wherein the first means for inhibiting the flow of charge carriers is positioned between the means for providing the first signal and the means for forming a capacitive region;

second means for inhibiting a flow of charge carriers, the second means for inhibiting the flow of charge carriers in contact with the means for forming the capacitive region; and means for receiving a second signal, the means for receiving the second signal extending at least partially through the second means for inhibiting the flow of charge carriers, wherein the means for forming the capacitive region is disposed between the first means for inhibiting the flow of charge carriers and the second means for inhibiting the flow of charge carriers, and wherein the means for forming the capacitive region includes a first doped region, a second doped region, and a signal path region between the first doped region and the second doped region.

20. The apparatus of claim 19, wherein the means for providing the first signal comprises a front-side contact, and wherein the means for receiving the second signal comprises a backside contact.

21. The apparatus of claim 19, further comprising means for biasing using a bias voltage, wherein a capacitance of the capacitive region is based on the bias voltage.

22. The apparatus of claim 21, wherein the means for biasing includes a third contact.

23. The apparatus of claim 22, wherein the means for biasing further includes a fourth contact.

24. The apparatus of claim 19, wherein the means for providing and the means for receiving are integrated within a mobile device.

25. An apparatus comprising:
a substrate having a first side and an opposite second side;
a first contact of a varactor device spaced from the first side of the substrate;
an insulator layer disposed on the second side of the substrate; and
a second contact of the varactor device, the second contact extending at least partially through the insulator layer and in physical contact with the substrate, wherein the substrate includes a first doped region, a second doped region, and a signal path region between the first doped region and the second doped region.

26. The apparatus of claim 25, further comprising:
a third contact, the first doped region disposed between the third contact and the insulator layer; and
a fourth contact, the second doped region disposed between the fourth contact and the insulator layer.

27. The apparatus of claim 25, further comprising a die, wherein the die comprises the first contact and the second contact.

28. The apparatus of claim 27, further comprising a device that includes a mobile device, a computer, a set top box, a music player, a video player, an entertainment unit, a navigation device, a communications device, a personal digital assistant (PDA), or a fixed location data unit, wherein the die is integrated within the device.

29. An apparatus comprising:
a substrate;
a first contact of a varactor device;
a second contact of the varactor device, wherein the first contact and the second contacts are disposed on opposite sides of the substrate, and wherein the second contact extends through an insulator layer and is in physical contact with the substrate;

a third contact of the varactor device coupled to the substrate, the third contact configured to receive a bias voltage; and a fourth contact of the varactor device, the fourth contact coupled to the third contact, the fourth contact configured to receive the bias voltage.

30. The apparatus of claim 29, further comprising:

a signal path between the first contact and the second contact; and a silicon on insulator (SOI) structure that includes an insulator layer and the substrate, wherein the substrate comprises silicon, and wherein the second contact extends through the insulator layer.

* * * * *